United States Patent
Lee et al.

(10) Patent No.: US 9,437,295 B2
(45) Date of Patent: *Sep. 6, 2016

(54) SEMICONDUCTOR SYSTEM INCLUDING SEMICONDUCTOR MEMORY APPARATUS AND TEMPERATURE CONTROL METHOD THEREOF

(71) Applicant: SK hynix Inc., Gyeonggi-do (KR)

(72) Inventors: Seung Yun Lee, Gyeonggi-do (KR); Hae Chan Park, Gyeonggi-do (KR); Myoung Sub Kim, Gyeonggi-do (KR); Se Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/956,823

(22) Filed: Dec. 2, 2015

(65) Prior Publication Data

US 2016/0086663 A1 Mar. 24, 2016

Related U.S. Application Data

(63) Continuation-in-part of application No. 14/158,496, filed on Jan. 17, 2014, now Pat. No. 9,236,121.

(30) Foreign Application Priority Data

Oct. 22, 2013 (KR) .................. 10-2013-0126026

(51) Int. Cl.
  *G11C 11/00* (2006.01)
  *G11C 13/00* (2006.01)
  *G11C 7/04* (2006.01)

(52) U.S. Cl.
  CPC ............ *G11C 13/004* (2013.01); *G11C 7/04* (2013.01); *G11C 13/0004* (2013.01); *G11C 13/0033* (2013.01); *G11C 13/0038* (2013.01); *G11C 2013/008* (2013.01)

(58) Field of Classification Search
  CPC . G11C 13/0004; G11C 13/0069; G11C 7/04; G11C 7/406
  USPC ......................................... 365/148, 163, 211
  See application file for complete search history.

(56) References Cited

U.S. PATENT DOCUMENTS 9,236,121 B2 * 1/2016 Lee .................... G11C 13/0004

* cited by examiner

*Primary Examiner* — Huan Hoang
(74) *Attorney, Agent, or Firm* — IP & T Group LLP

(57) ABSTRACT

A semiconductor memory apparatus and a temperature control method thereof are provided. The semiconductor memory apparatus includes a temperature adjustment unit suitable for adjusting a temperature of a memory cell, and a temperature control unit suitable for sensing a temperature of the temperature adjustment unit, comparing a sensed temperature with a reference temperature range, and controlling the temperature adjustment unit to adjust the temperature thereof within the reference temperature range based on a comparison result.

20 Claims, 6 Drawing Sheets

SEMICONDUCTOR SYSTEM INCLUDING SEMICONDUCTOR MEMORY APPARATUS AND TEMPERATURE CONTROL METHOD THEREOF

CROSS-REFERENCES TO RELATED APPLICATION

This application is a continuation-in-part of application Ser. 14/158,496, filed Jan. 17, 2014, titled "Semiconductor Memory Apparatus And Temperature Control Method Thereof", which claims priority under 35 U.S.C. 119(a) to Korean application No. 10-2013-0126026, filed on Oct. 22, 2013, the Korean intellectual property Office. The disclosure of each of the foregoing applications is incorporated by reference in its entirety.

BACKGROUND

1. Technical Field

Various embodiments of the inventive concept relate to a semiconductor integrated circuit, and more particularly, to a semiconductor memory apparatus and a temperature control method thereof.

2. Related Art

With demands in low power semiconductor memory devices, next generation semiconductor memory devices with non-volatility and non-memory refresh have been researched. A phase-change random access memory device (PCRAM), which is one of the next generation semiconductor memory devices, stores data using a resistance difference between an amorphous state and a crystalline state of a phase-change material. The phase-change material changes between the amorphous state and the crystalline state by an electrical pulse applied thereto.

Germanium (Ga)-antimony (Sb)-tellurium (Te)-based material (hereinafter, referred to as GST), which is a chalcogenide, has been most widely used as a phase-change material of a general PCRAM. This is because the GST material has a fast phase-change rate and good oxidation resistance and is stable.

The GST material has a characteristic that its resistance value is changed under an effect of an external temperature. In other words, the resistance of the GST material is reduced in a high temperature and increased in a low temperature, regardless of phase-change, Thus, when the resistance of the GST material is measured by applying a certain voltage regardless of a temperature of the GST material, a measured resistance value of the GST material is different depending on temperature change. Specifically, in a multi-level cell, resistance values of multi-levels may not be accurately distinguished and thus a data error occurs.

SUMMARY

According to an exemplary embodiment of the inventive concept, there is provided a semiconductor system including a memory device including a semiconductor substrate and a memory cell formed on the substrate, a control block for controlling the memory device a temperature adjustment unit suitable for adjusting a temperature of a memory cell and formed over the memory cell, and a temperature control unit suitable for sensing a temperature of the temperature adjustment unit, comparing a sensed temperature with a reference temperature range, and controlling the temperature adjustment unit to adjust the temperature thereof within the reference temperature range based on a comparison result, and formed in the control block.

According to another exemplary embodiment of the inventive concept, there is provided a semiconductor system including a memory device including a semiconductor substrate and a memory cell formed on the substrate, a control block for controlling the memory device, a temperature adjustment unit suitable for adjusting a temperature of a memory cell; and a temperature control unit suitable for sensing a temperature of the temperature adjustment unit, comparing a sensed temperature with a reference temperature range, and controlling the temperature adjustment unit to adjust the temperature thereof within the reference temperature range based on a comparison result, and formed in the control block, wherein memory device includes a word line region formed on the semiconductor substrate, a switching device formed on the word line region, a data storage region formed on the switching device and a bit line formed on the data storage region and wherein the temperature adjustment unit is formed in a rear surface of the semiconductor substrate, According to another exemplary embodiment of the inventive concept, there is provided a semiconductor system including a memory device including a semiconductor substrate, a plurality of memory cells formed on the semiconductor substrate and a temperature adjustment unit for adjusting a temperature of the memory cells, and a control block including a temperature control unit for controlling and verifying the temperature of the memory cells, wherein the temperature control unit includes a temperature sensing which includes a memory cell being same with the memory cell of the memory device and a temperature adjust unit being same with the temperature adjust unit of the memory device.

These and other features, aspects and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
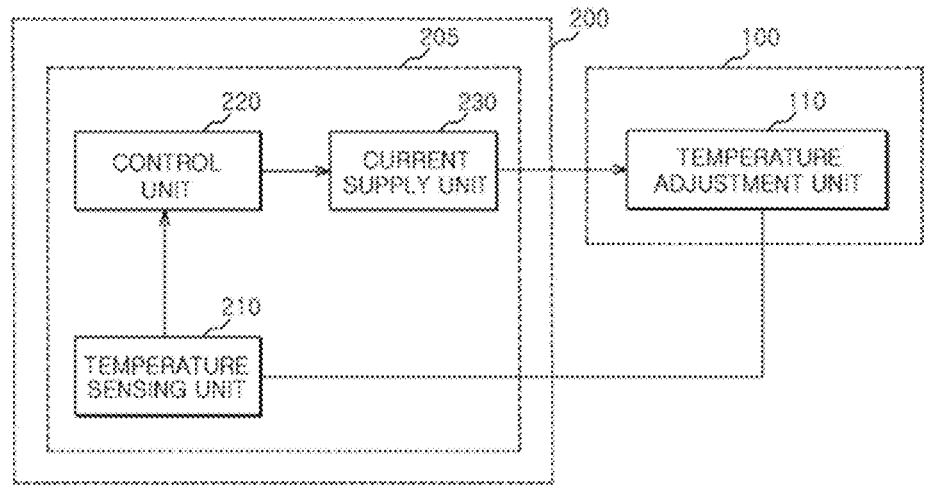
FIG. 1 is a block diagram illustrating a configuration of a semiconductor memory apparatus according to an embodiment of the inventive concept.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity, Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

Although a few embodiments of the inventive concept will be shown and described, it will be appreciated by those of ordinary skill in the art that changes may be made in these exemplary embodiments without departing from the principles and spirit of the inventive concept.

FIG. 1 is a block diagram illustrating a configuration of a semiconductor memory apparatus according to an embodiment of the inventive concept.

Referring to FIG. 1, the semiconductor system according to an embodiment of the inventive concept may be divided into a memory device 100 and a control block 200. The memory device 100 and the control block 200 are formed in one chip. Further, the memory device 100 is formed in a first chip and the control block 200 is formed in a second chip. The first chip and the second chip may be stacked.

The memory device 100 may include a plurality of memory cells (not shown) and a temperature adjustment unit 110, and the temperature adjustment unit 110 may receive current from a current supply unit 230 of the control block 200 and adjust/maintain temperatures of the memory device 100 to be constant. A detailed configuration of the memory device 100 will be described in detail with reference to FIG. 2 or 3.

The control block 200 may include a circuit (not shown) for controlling the memory device 100 and a temperature control unit 205 including a temperature sensing unit 210, a control unit 220, and the current supply unit 230.

The temperature sensing unit 210 may sense a temperature of the memory device 100. The temperature sensing unit 210 transmit a temperature sensing result to the control unit 220. The temperature sensing unit 210 may be formed of the same structure of the memory cell of the memory device 100. Therefore, the temperature sensing unit 210 may include a same condition with the memory cell of the memory device 100.

The control unit 220 compares the temperature sensing result transmitted from the temperature sensing unit 210 with a preset reference temperature range. When the temperature sensing result is smaller than the reference temperature range, the control unit 220 controls the current supply unit 230 to supply current to the temperature adjustment unit 110 and controls a temperature of the memory device 100 to be within the reference temperature range.

The current supply unit 230 supplies the current to the temperature adjustment unit 110 in response to a control command transmitted from the control unit 220.

Figure 2:
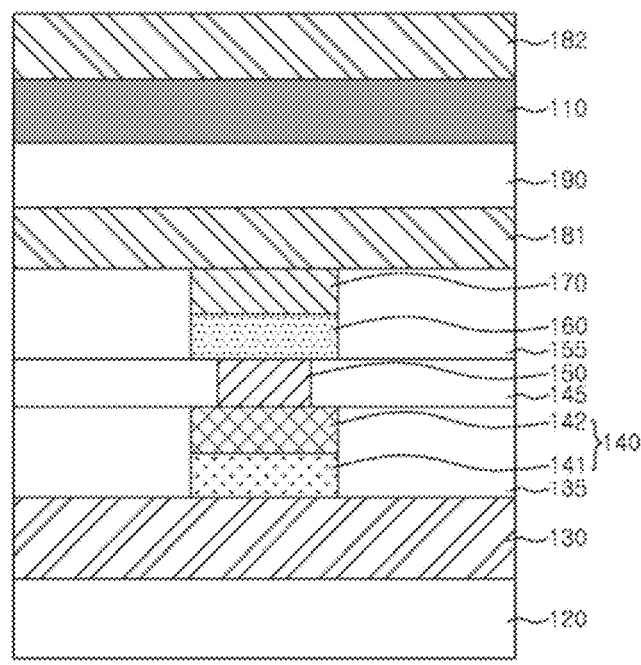
FIG. 2 is a cross-sectional view illustrating a memory cell of a semiconductor memory apparatus according to an embodiment of the inventive concept.

FIG. 2 is a cross-sectional view illustrating a memory cell of a semiconductor memory apparatus according to an embodiment of the inventive concept.

Referring to FIG. 2, a memory cell 100A of the semiconductor memory apparatus according to an embodiment of the inventive concept may include a word line region 130 formed on a semiconductor 120, a switching device 140 formed on the word line region 130 and including an N type region 141 and a P type region 142, a bottom electrode 150 formed on the switching device 140, a data storage unit 160 formed on the bottom electrode 150, an top electrode 170 formed on the data storage unit 160 a first metal line region 181 formed on the top electrode 170. A buffer layer 190 is formed on the first metal line region 181, a temperature adjustment unit 110 is formed on the buffer layer 190, and a second metal line region 182 is formed on the temperature adjustment unit 110. The data storage unit 160 may include a phase-change layer formed of a phase-change material, for example, GST. The reference numerals 135, 145, and 155 denote a first insulating layer, a second insulating layer, and a third insulating layer. Further, the temperature adjustment unit 110 may be formed of a material of which resistance is reduced or increased when a temperature thereof is increased. The material of which the resistance is reduced when the temperature thereof is increased may be oxide containing nickel (Ni) and manganese (Mn) and the material of which the resistance is increased when the temperature thereof is increased may be a $BiTiO_3$ compound or a $PbTiO_3$ compound. The buffer layer 190 may be oxide. For example, the first metal line region 181 may be a bit line. Further, the temperature adjustment unit 110 may be electrically connected to the second metal line region 182 and the temperature adjustment unit 110 may receive a current for changing the resistance thereof from the second metal line region 182. For example, the second metal line region 182 may be connected to the current supply unit 230 of the control block 200.

The temperature sensing unit 210 may be formed to may include the same structure as the memory cell 102. Thus, the temperature adjustment unit 110 and the temperature sensing unit 210 may be formed in the same process at the same time. Therefore, process cost and process time of the semiconductor system may be reduced.

Figure 3:
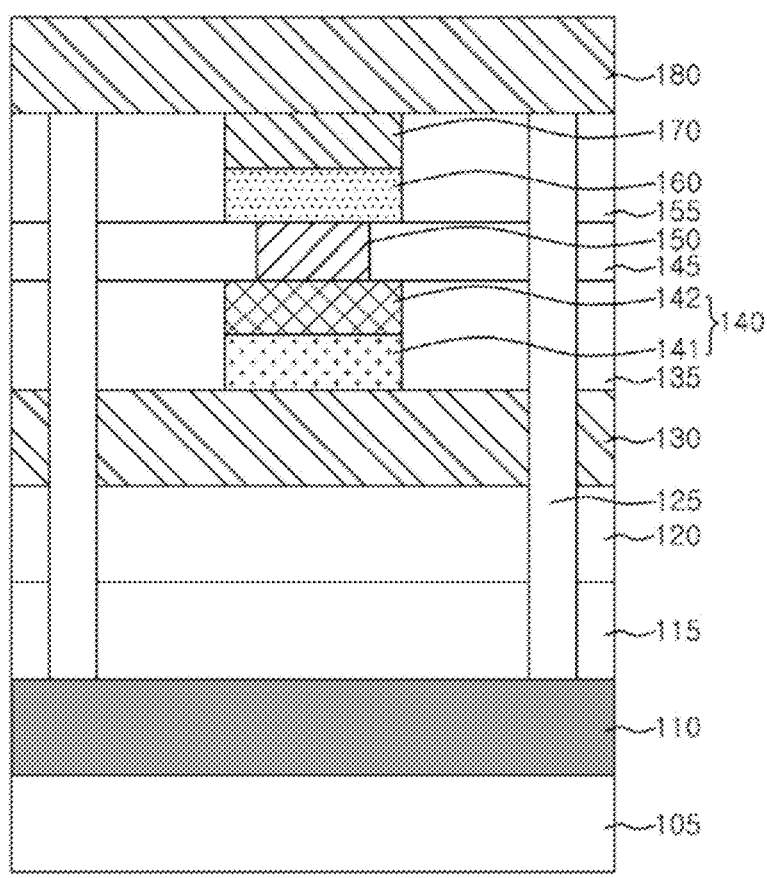
FIG. 3 is a cross-sectional view illustrating a memory cell of a semiconductor memory apparatus according to an embodiment of the inventive concept.

FIG. 3 is a cross-sectional view illustrating a memory cell of a semiconductor memory apparatus according to an embodiment of the inventive concept.

Referring to FIG. 3, the cell 100B of the memory device 100 apparatus according to another embodiment of the inventive concept may include a first buffer layer 115 formed on a rear surface of a semiconductor substrate 120, a temperature adjustment unit 110 formed on the first buffer layer 115, and a second buffer layer 105 formed on the temperature adjustment unit 110 to protect the temperature adjustment unit 110. The cell 100B may further include a contact via 125 formed between the temperature adjustment unit 10 and a metal line region 180, a word line region 130 formed on the semiconductor 120, a switching device 140 formed on the word line region 130 and including an N type region 141 and a P type region 142, a bottom electrode 150 formed on the switching device 140, a data storage unit 160 formed on the bottom electrode 150, an top electrode 170 formed on the data storage unit 160, and the metal line region 180 formed on the top electrode 170. The data storage unit 160 may include a phase-change layer formed of a phase-change material, for example, GST. The reference numerals 135, 145, and 155 denote a first insulating layer, a second insulating layer, and a third insulating layer. Further, the first buffer layer 115 and the second buffer layer 105 may be formed of the same material, for example, oxide, The temperature adjustment unit 110 is electrically connected to the metal line region 180 by the contact via 125. Further, the metal line region 180 may be a bit line. Although not shown in FIG. 3, the contact via 125 may include a conductive material and the contact via 125 should be insulated from the word line region 130.

As described in FIG. 2, the temperature adjustment unit 110 may include a material of which resistance is reduced or increased when a temperature thereof is increased. Since the memory cell 100B and the temperature sensing unit 210 of the control block 200 are formed to have the same structure, the temperature sensing unit 210 may foresee a temperature of the cell 100B. Further, the temperature adjustment unit 110 and the temperature sensing unit 210 may be formed in the same process at the same time. Therefore, process cost and process time of the semiconductor system may be reduced.

FIGS. 2 and 3 illustrate that the switching device 140 is a PN diode including the N type region 141 and the P type region 142, but the switching device is not limited thereto. The switching device 140 may be a shottky diode. Alternatively, the switching device may be a MOS transistor or OTS (ovonic threshold switch) device other than the diode.

Figure 4:
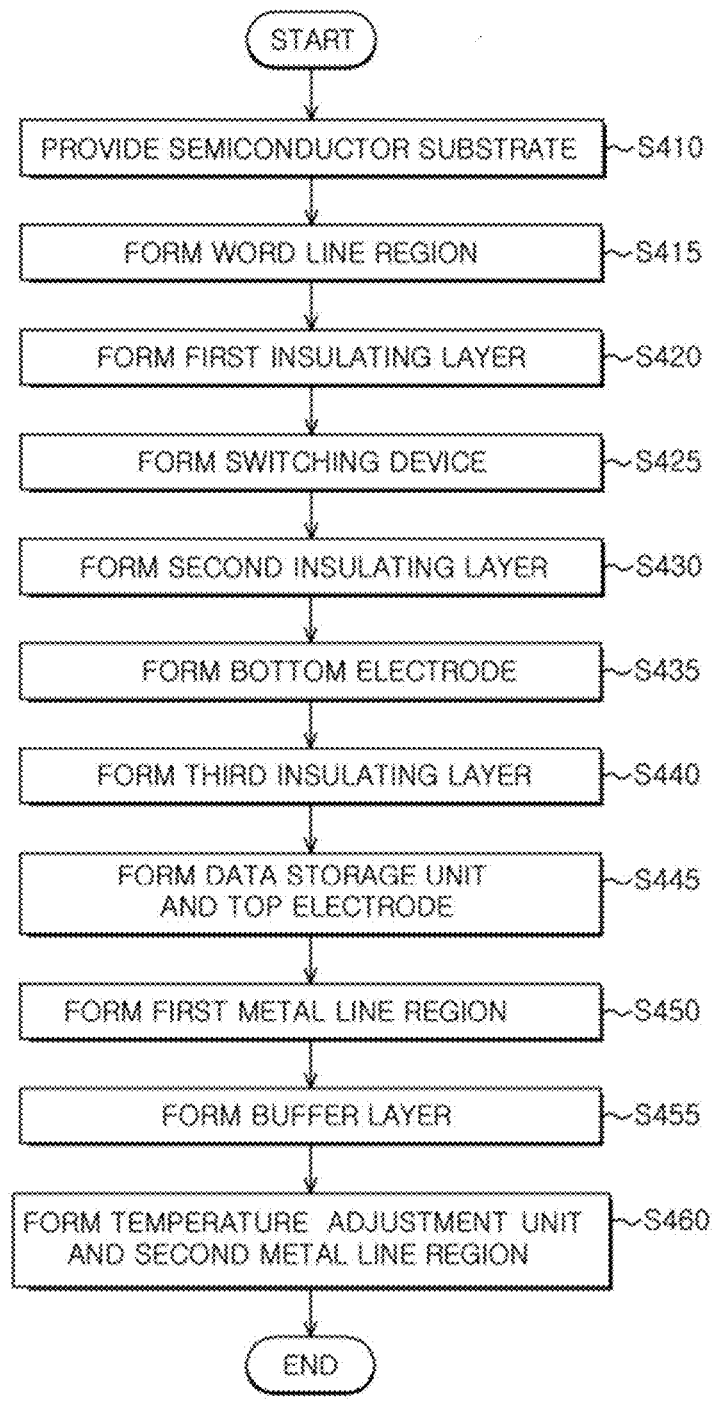
FIG. 4 is a flowchart sequentially illustrating a method of manufacturing a memory cell of a semiconductor memory apparatus according to an embodiment of the inventive concept.

FIG. 4 is a flowchart sequentially illustrating a method of manufacturing a semiconductor memory apparatus according to an embodiment of the inventive concept.

Referring to FIG. 4, the method of manufacturing a semiconductor system according to an embodiment of the inventive concept may include providing the semiconductor substrate 120 (S410), and forming the word line region 130 by implanting N type impurities into an upper portion of the semiconductor substrate 120 (S415).

The first insulating layer 135 including a hole is formed on the word line region 130 (S420), and the switching device 140 including the N type region 141 and the P type region 142 is formed in the hole (S425).

The second insulating layer 145 including a hole exposing an upper surface of the switching device 140 is formed on the first insulating layer 135 in which the switching device 140 is formed (S430), and the bottom electrode 150 is formed in the hole (S435).

The third insulating layer 155 including a hole is formed on the second insulating layer 145 in which the bottom electrode 150 is formed (S440), and the data storage unit 160 is formed in the hole, and the top electrode 170 is formed on the data storage unit 160 (S445). The data storage unit 160 may be a phase-change layer formed of a phase-change material, for example, GST. The data storage unit 160 may be formed by forming the hole in the third insulating layer 155, and forming the data storage unit 160 in the hole, but the method of forming the data storage unit 160 is not limited thereto. Alternatively, the data storage unit 160 may be formed by depositing a phase-change material for the data storage unit 160 and etching the phase-change material.

The first metal line region 181 is formed on the third insulating layer 155 in which the data storage unit 160 and the top electrode 170 are formed (S450), and the buffer layer 190 is formed on the first metal line region 181 (S455). The temperature adjustment unit 110 is formed on the buffer layer 190, and the second metal line region 182 is formed on the temperature adjustment unit 110 (S460). Therefore, the semiconductor system according to an embodiment of the inventive concept is completed. Although not shown in FIG. 4, when the temperature adjustment unit 110 is formed on the buffer layer 190, the temperature sensing unit 210 of the control block 200 may be simultaneously formed of the same material as the temperature adjustment unit 110.

Figure 5:
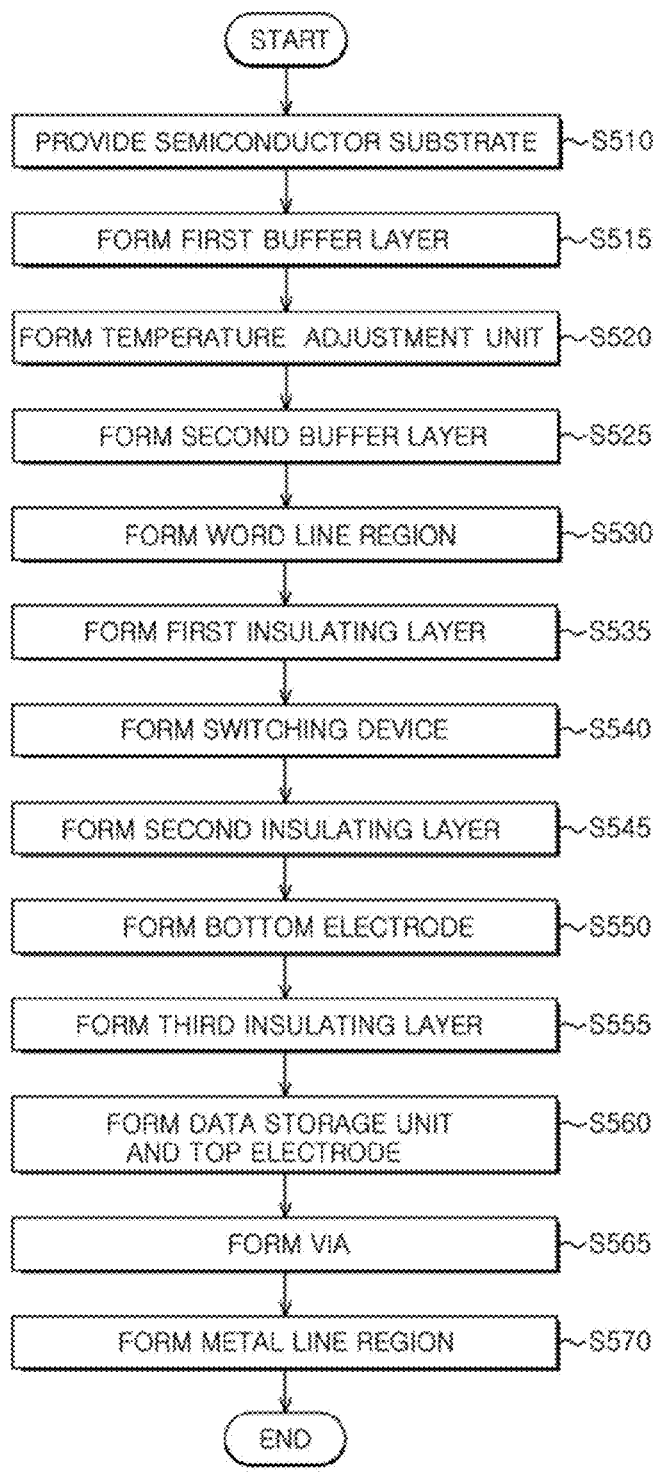
FIG. 5 is a flowchart sequentially illustrating a method of manufacturing a memory cell of a semiconductor memory apparatus according to an embodiment of the inventive concept.

FIG. 5 is a flowchart sequentially illustrating a method of manufacturing a semiconductor system according to another embodiment of the inventive concept.

Referring to FIG. 5, the method of manufacturing a semiconductor memory apparatus according to an embodiment of the inventive concept may include providing the semiconductor substrate 120 (S510), and forming the first buffer layer 115 on a rear surface of the semiconductor substrate 120 (S515).

The temperature adjustment unit 110 is formed on the first buffer layer 115 (S520). When the temperature adjustment unit 110 is formed on the first buffer layer 115, the temperature sensing unit 210 of the control block 200 may be simultaneously formed of the same material as the temperature adjustment unit 110.

The second buffer layer 105 that may protect the temperature adjustment unit 110 is formed on the temperature adjustment unit 110 (S525).

The word line region 130 is formed by implanting N type impurities into an upper portion of the semiconductor substrate 120, that is, a front surface of the semiconductor substrate 120 (S530).

The first insulating layer 135 including a hole is formed on the word line region 130 (S535), and the switching device 140 including the N type region 141 and the P type region 142 is formed in the hole (S540).

The second insulating layer 145 including a hole exposing an upper surface of the switching device 140 is formed on the first insulating layer 135 in which the switching device 140 is formed (S545), and the bottom electrode 150 is formed in the hole (S550).

The third insulating layer 155 including a hole is formed on the second insulating layer 145 in which the bottom electrode 150 is formed (S555), and the data storage unit 160 is formed in the hole, and the top electrode 170 is formed on the data storage unit 160 (S560). The data storage unit 160 may be a phase-change layer formed of a phase-change material, for example, GST. The data storage unit 160 may be formed by depositing a phase-change material for the data storage unit on the second insulating layer 145, and etching the phase-change material.

The semiconductor substrate 120, the first buffer layer 115, the first insulating layer 135, the second insulating layer 145, and the third insulating layer 155 are etched to form the contact via 125 on a portion of an upper surface of the temperature adjustment unit 110 (S565). The contact via 125 may include a heating wire that may adjust/maintain a temperature of the memory cell 100B to be constant.

The metal line region 180 is formed on the third insulating layer 155 in which the data storage unit 160 and the top electrode 170 are formed (S570). Therefore, the semiconductor memory apparatus according to another embodiment of the inventive concept is completed.

Figure 6:
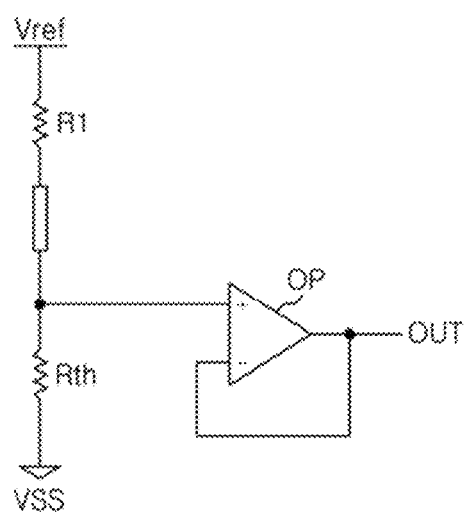
FIG. 6 is a circuit diagram illustrating a temperature sensing unit of a semiconductor memory apparatus according to an embodiment of the inventive concept.

FIG. 6 is a circuit unit illustrating a temperature sensing unit of a semiconductor memory apparatus according to an embodiment of the inventive concept.

Referring to FIG. 6, the temperature sensing unit 210 according to an embodiment of the inventive concept may include a thermistor Rth that may sense a temperature of the temperature adjustment unit 110 disposed in the memory cell 100A or 100B. The thermistor Rth has properties in which a resistance value is reduced or increased when a temperature is increased. The material in which the resistance value is reduced when a temperature is increased may include, for example, oxide containing Ni and Mn, and the material in which the resistance is increased when the temperature is increased may include, for example, a $BiTiO_3$ compound or a $PbTiO_3$ compound.

The temperature sensing unit 210 may include a comparator OP that may receive a voltage value of the thermistor Rth as an input signal compare the input signal with a preset reference voltage range, and output a temperature sensing signal OUT.

The temperature sensing signal OUT outputted from the comparator OP is transmitted to the control unit 220 to control the temperature of the memory device according to an embodiment of the inventive concept to be described later.

Figure 7:
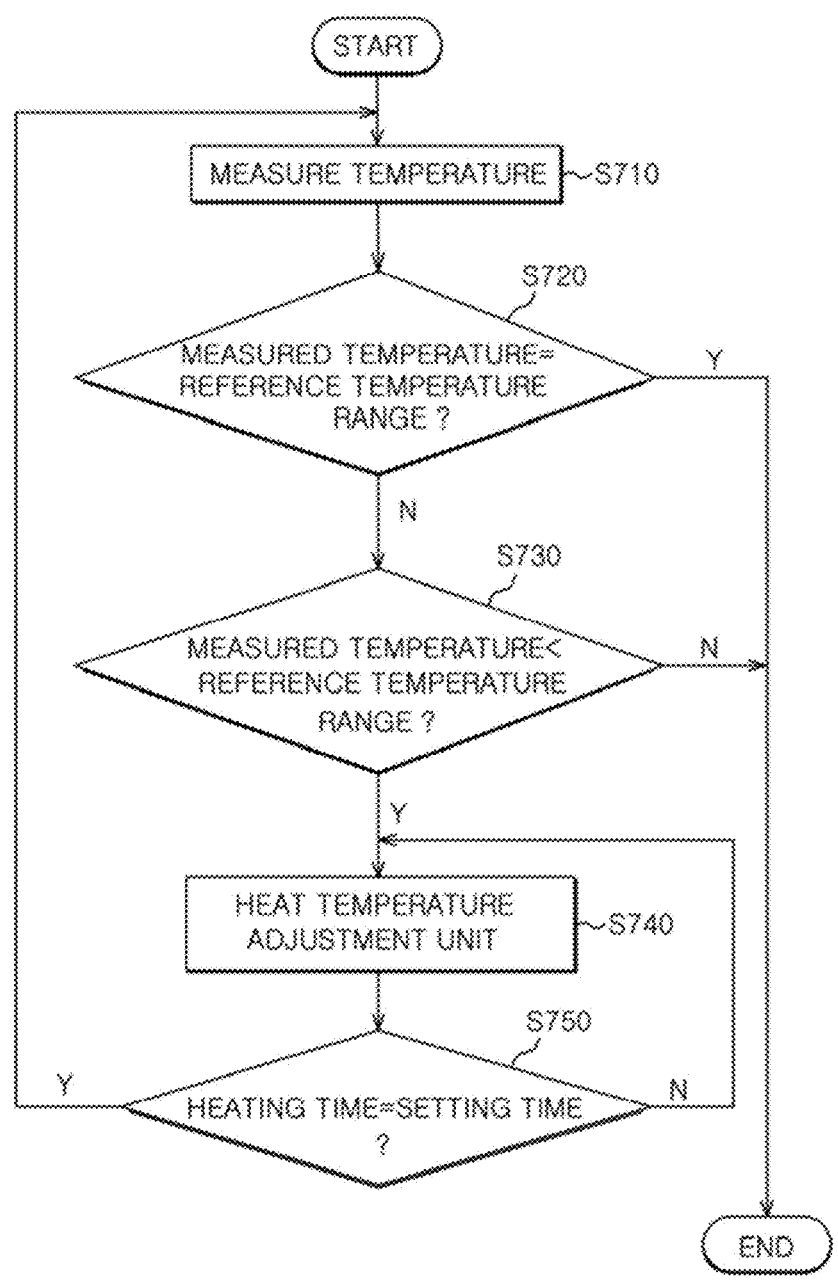
FIG. 7 is a flowchart illustrating a temperature control method of a semiconductor memory apparatus according to an embodiment of the inventive concept.

FIG. 7 is a flowchart illustrating a temperature control and verify method of a semiconductor system according to an embodiment of the inventive concept.

Referring to FIG. 7, a temperature of the temperature adjustment unit 110 of the memory cell 100A or 100B is measured (S710), and it is determined whether or not the measured temperature is within a preset reference temperature range (S720).

When the measure temperature is within the preset reference temperature range, the temperature control operation is terminated, and when the measure temperature is not within the preset reference temperature range, it is determined again whether or not the measured temperature is smaller than the preset reference temperature range (S730).

As a determination result, when the measured temperature is smaller than the preset reference temperature range, a control signal is inputted to the current supply unit 230, and the temperature adjustment unit 110 is heated (S740). When the measured temperature is larger than the preset reference temperature range, it is not necessary to heat the temperature adjustment unit 110, and thus the temperature control method is terminated.

It is determined whether or not a heating time reaches a reference setting time (S750), and when the heating time is reaches the reference setting time, the temperature of the temperature adjustment unit 110 is measured again (S710). When it is determined that the heating time does not reach the reference setting time, the temperature adjustment unit 110 is heated again for a preset time (S740).

It is determined again whether or not the measured temperature of the temperature adjustment unit 110 is within the preset reference temperature range (S720), and when the measured temperature is within the preset reference temperature range, the temperature control method is terminated.

The semiconductor system and the temperature control method thereof according to an embodiment of the inventive concept maintain a temperature of a phase-change material to be constant, and thus prevent a data error due to change of an external temperature and improve reliability of the semiconductor system.

The embodiment of the inventive concept has exemplarily described the PCRAM among semiconductor memory apparatuses, but the inventive concept is not limited thereto. Technology for adjusting/maintaining a certain temperature of a temperature adjustment unit by sensing its temperatures may be applied to improve refresh properties of a dynamic random access memory (DRAM).

The above embodiment of the present invention is illustrative and not limitative, Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor system, comprising:
    a memory device including a semiconductor substrate and a memory cell formed on the substrate;
    a control block for controlling the memory device;
    a temperature adjustment unit suitable for adjusting a temperature of the memory cell and formed over the memory cell; and
    a temperature control unit suitable for sensing a temperature of the temperature adjustment unit, comparing a sensed temperature with a reference temperature range, and controlling the temperature adjustment unit to adjust the temperature thereof within the reference temperature range based on a comparison result, and formed in the control block.

2. The semiconductor system of claim 1, wherein the temperature adjustment unit includes a memory cell being same with the memory cell of the memory device and a temperature adjustment unit being same with the memory device.

3. The semiconductor system of claim 1, wherein the memory cell includes:
    a word line region formed on the semiconductor substrate;
    a switching device formed on the word line region;
    a data storage region formed on the switching device; and
    a bit line formed on the data storage region.

4. The semiconductor system of claim 3, further comprising:
    a buffer layer formed on the bit line; and
    a metal line formed over the buffer layer and electrically connected to the temperature control unit;
    wherein the temperature adjustment unit is formed between the buffer layer and the metal line, the temperature adjustment unit receive a current for adjusting the temperature of the memory cell from the metal line.

5. The semiconductor system of claim 1, wherein the temperature adjustment unit includes a material of which a resistance value is reduced when a temperature thereof is increased or a material of which a resistance value is increased when the temperature thereof is increased.

6. The semiconductor system of claim 3, wherein the data storage region includes:
    a bottom electrode formed on the switching device;
    a data storage unit formed on the bottom electrode; and
    a top electrode formed on the data storage unit.

7. The semiconductor system of claim 6, wherein the data storage unit is formed of a phase-change material.

8. The semiconductor system of claim 1, wherein the memory device and the control block are formed in one chip.

9. The semiconductor system of claim 1, wherein the memory device and the control block are formed in different chips.

10. The semiconductor system of claim wherein the temperature control unit includes:
    a temperature sensing unit suitable for sensing the temperature of the temperature adjustment unit;

a control unit suitable for receiving the sensed temperature of the temperature sensing unit and generating a control signal to control the temperature of the temperature adjustment unit; and a current supply unit suitable for supplying current to the temperature adjustment unit in response to the control signal, wherein the current is provided to the temperature adjustment unit though a metal line.

11. A semiconductor system, comprising:

a memory device including a semiconductor substrate and a memory cell formed on the substrate;

a control block for controlling the memory device;

a temperature adjustment unit suitable for adjusting a temperature of the memory cell; and a temperature control unit suitable for sensing a temperature of the temperature adjustment unit, comparing a sensed temperature with a reference temperature range, and controlling the temperature adjustment unit to adjust the temperature thereof within the reference temperature range based on a comparison result, and formed in the control block, wherein the memory device includes:

a word line region formed on the semiconductor substrate;

a switching device formed on the word line region;

a data storage region formed on the switching device; and a bit line formed on the data storage region, and wherein the temperature adjustment unit is formed in rear surface of the semiconductor substrate.

12. The semiconductor system of c further comprising:

a first buffer layer formed between the rear surface of the semiconductor substrate and the temperature adjustment unit; and a second buffer layer formed on the temperature adjustment unit.

13. The semiconductor system of claim 11, wherein the temperature adjustment unit is electrically connected to the bit line by a via contact.

14. The semiconductor memory apparatus of claim 11, wherein the temperature adjustment unit includes a material of which a resistance value is reduced when a temperature thereof is increased or a material of which a resistance value is increased when the temperature thereof is increased.

15. The semiconductor memory apparatus of claim 11, wherein the data storage region includes:

a bottom electrode formed on the switching device;

a data storage unit formed on the bottom electrode; and a top electrode formed on the data storage unit, wherein the data storage unit is formed of a phase-change material.

16. The semiconductor system f claim 11, wherein the temperature control unit includes:

a temperature sensing unit suitable for sensing the temperature of the temperature adjustment unit;

a control unit suitable for receiving the sensed temperature of the temperature sensing unit and generating a control signal to control the temperature of the temperature adjustment unit; and a current supply unit suitable for supplying current to the temperature adjustment unit in response to the control signal, wherein the current is provided to the temperature adjustment unit through the bit line.

17. The semiconductor memory apparatus of claim 16, wherein the temperature adjustment unit and the temperature sensing unit include a same material of which a resistance value is reduced or increased when a temperature thereof is increased.

18. A semiconductor system, comprising:

a memory device including a semiconductor substrate, a plurality of memory cells formed on the semiconductor substrate and a temperature adjustment unit for adjusting a temperature of the memory cells; and a control block including a temperature control unit for controlling and verifying the temperature of the memory cells, wherein the temperature control unit includes a temperature sensing unit which includes a memory cell being same with the memory cell of the memory device and a temperature adjust unit being same with the temperature adjust unit of the memory device.

19. The semiconductor system of claim 18, wherein the temperature adjustment unit includes a material of which a resistance value is reduced or increased when a temperature thereof is increased.

20. The semiconductor system of claim 19, wherein the material of the temperature adjustment unit includes a thermistor material.

* * * * *